United States Patent
Snelten et al.

[11] Patent Number: 5,916,162
[45] Date of Patent: Jun. 29, 1999

[54] INVASIVE DEVICE FOR USE IN A MAGNETIC RESONANCE IMAGING APPARATUS

[75] Inventors: Jeroen Snelten; Hans H. Tuithof, both of Eindhoven, Netherlands

[73] Assignee: U.S. Philips Corporation, New York, N.Y.

[21] Appl. No.: 08/914,595

[22] Filed: Aug. 18, 1997

[30] Foreign Application Priority Data

Sep. 2, 1996 [EP] European Pat. Off. .............. 96202428

[51] Int. Cl.⁶ ................................................. A61B 5/055
[52] U.S. Cl. .......................... 600/411; 600/423; 600/424
[58] Field of Search .................................. 600/411, 422, 600/423, 424; 128/901; 174/104

[56] References Cited

U.S. PATENT DOCUMENTS 4,841,248  6/1989  Mehdizadeh et al. .................. 600/422
5,069,213  12/1991  Polczynski .............................. 600/323
5,318,025  6/1994  Dumoulin et al. ...................... 600/424

*Primary Examiner*—Ruth S. Smith
*Attorney, Agent, or Firm*—Dwight H. Renfrew, Jr.

[57] ABSTRACT

An invasive device which is intended to cooperate with a magnetic resonance imaging apparatus is provided with an RF coil which is situated near a distal part of the invasive device. The RF coil is used so as to visualize the position of a distal end of the invasive device, introduced into an object, in an image of the object. Current induced by an RF field to be generated by the magnetic resonance imaging apparatus develops heat in the electric connection between the RF coil and a control unit, which may be annoying to a patient. In order to counteract the development of heat in the invasive device, the invasive device is provided with a hollow carrier. The electric connection extends through said carrier which is provided with an electrically conductive shield with an additional resistance.

20 Claims, 2 Drawing Sheets

INVASIVE DEVICE FOR USE IN A MAGNETIC RESONANCE IMAGING APPARATUS

BACKGROUND OF THE INVENTION

1. Field of the Invention

The invention relates to an invasive device which is intended to cooperate with a magnetic resonance imaging apparatus, is arranged to be introduced into an object, and is provided with an RF coil which is situated near a distal portion of the invasive device and can be coupled to a control unit via an electric connection.

2. Description of Related Art

An invasive device of this kind is known from U.S. Pat. No. 5,318,025. The known invasive device is used in interventional procedures where the invasive device is guided to an organ via an opening in the body of a patient. To this end, RF fields and magnetic fields are applied so as to generate magnetic resonance signals of spins in a part of the body where the distal end of the invasive device is situated. The RF coil receives a magnetic resonance signal from spins in the body in the vicinity of the RF coil. The signal received by the RF coil is used to determine, in cooperation with the magnetic resonance apparatus, the position of the distal part of the invasive device in the body of the patient. Subsequently, this position is superposed on an image of the body, via a cursor, so as to be displayed on a monitor.

It is a drawback of the known invasive device that the generated RF fields heat the conductors of the electric connection in the catheter and also the object; this is annoying to the patient.

SUMMARY OF THE INVENTION

It is an object of the invention to reduce the development of heat in the catheter. To this end, the invasive device according to the invention is characterized in that it is provided with a hollow carrier which has a distal end and a proximal end, the electric connection extending through said carrier, which is provided with an electrically conductive shield which extends over a distance from the distal end to the proximal end and has an electric resistance over said distance which is substantially higher than the electric resistance of the electric connection over the same distance. This step reduces the development of heat in the electric shield and the object because the current induced in the electric shield is substantially smaller than the current which would be induced in the non-shielded connection.

A further embodiment of the invasive device according to the invention is characterized in that, viewed in the longitudinal direction, the electric shield comprises alternately electrically highly conductive portions and electrically less conductive portions. It is thus achieved that the electric shield of the electric connection has a resistance for reducing the induced current, the remainder of the shield containing a suitably conductive material for adequate suppression of the RF field on the electric connection.

A further embodiment of the invasive device according to the invention is characterized in that the distance between the successive electrically less conductive portions is smaller than or equal to approximately ¼ wavelength of the RF field generated in the object by the magnetic resonance imaging apparatus in order to excite spins in the object to be examined. The shield portions of lower electric conductivity in this case counteract the appearance of standing EM waves in the electric shield.

A further invasive device according to the invention is characterized in that the shield contains a material which is uniformly distributed across the length of the shield and has a specific resistance which is substantially higher than a specific resistance of a material constituting the electric connection. This step also counteracts the appearance of the standing EM waves, the electric shield remaining closed along the entire electric connection.

A further embodiment of the invasive device according to the invention is characterized in that the conductive material of the shield contains a flexible material. Because of the use of a flexible material, the carrier remains mechanically suitably bendable and flexible, and hence also the invasive device, so that the invasive device can be readily introduced into the object.

A further embodiment of the invasive device according to the invention is characterized in that the conductive material of the shield contains a conductive synthetic material. A conductive synthetic material offers the advantage that it can be readily provided on the carrier.

A further embodiment of the invasive device according to the invention is characterized in that the electric connection comprises coaxial conductors. The use of coaxial conductors in the electric connection between the RF coil and the invasive device control unit further reduces the effect of an RF field on the signal received.

The invention also relates to a magnetic resonance imaging apparatus provided with an invasive device.

The above and other, more detailed aspects of the invention will be described in detail hereinafter, by way of example, with reference to the drawing.

DETAILED DESCRIPTION OF THE PREFERRED EMBODIMENTS

Figure 1:
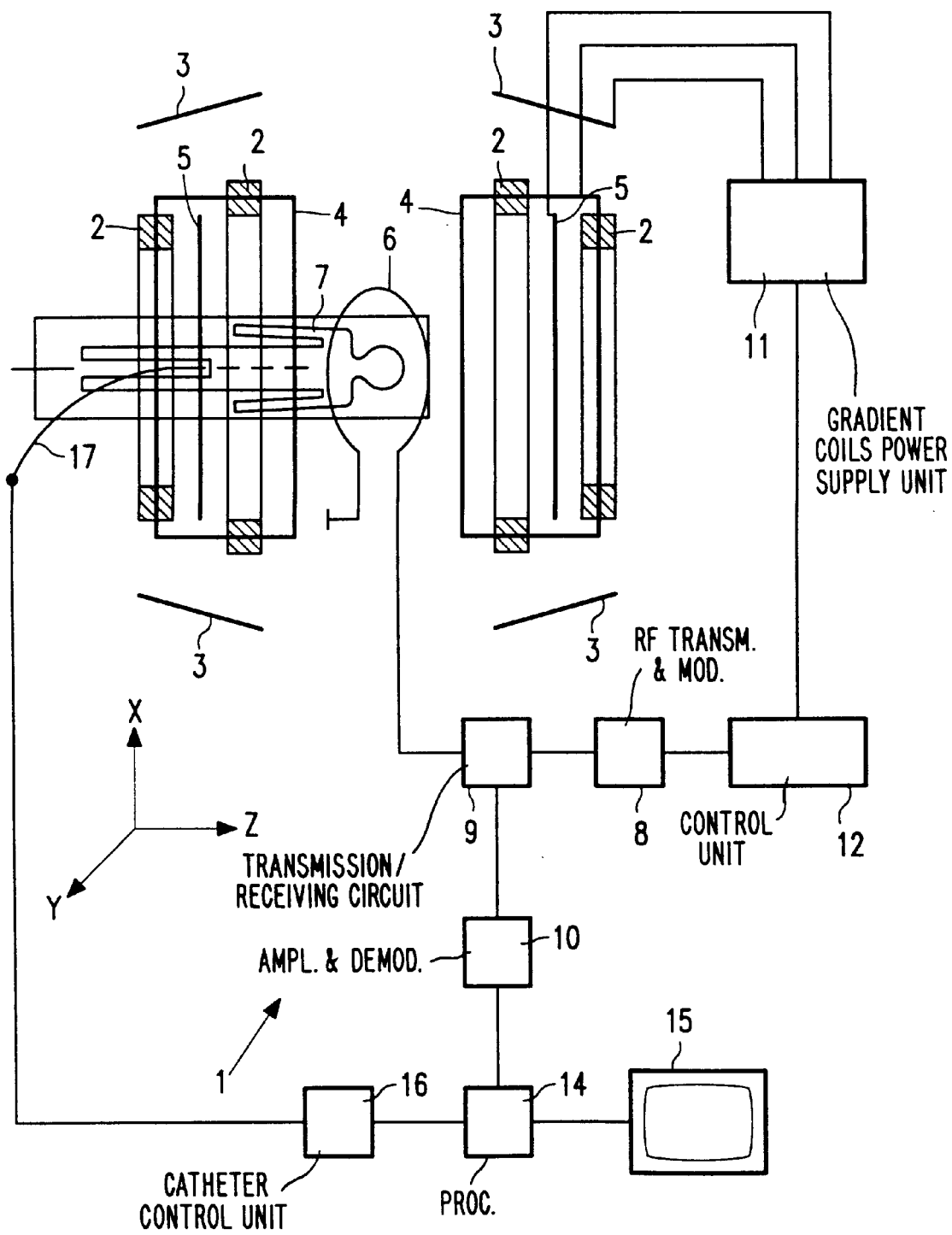
FIG. 1 shows an embodiment of a magnetic resonance imaging apparatus.

FIG. 1 shows a magnetic resonance imaging apparatus which includes a first magnet system 2 for generating a static magnetic field. The Z direction of the coordinate system shown corresponds by convention to the direction of the static magnetic field in the magnet system 2. The magnetic resonance imaging apparatus also includes several gradient coils 3, 4, 5 for generating additional magnetic fields having a gradient in the X, the Y, and the Z direction. The gradient coils 3, 4, 5 are fed by a power supply unit 11. The magnet system 2 encloses an examination space which is large enough to accommodate a part of an object to be examined, for example a patient 7. An RF transmitter coil 6 serves to generate RF fields and is connected, via a transmission/receiving circuit 9, to an RF transmitter and modulator 8.

The RF transmitter coil 6 is arranged around or on a part of the patient 7 in the examination space. There is also provided, a receiving coil which is connected to a signal amplifier and demodulation unit 10 via the transmission/ receiving circuit 9. The receiving coil may be the same coil as the transmitter coil 6. A control unit 12 controls the modulator 8 and the power supply unit 11 in order to generate special pulse sequences which contain RF pulses and gradients. After excitation of spins by means of RF pulses to be generated in a part of the body which is situated in the examination space, a magnetic resonance signal can be received by means of the receiving coil 6. The information of the magnetic resonance signal derived from the demodulation unit 10 is applied to a processing unit 14. The processing unit 14 processes the information into an image by transformation. This image can be displayed, for example on a monitor 15. FIG. 1 also shows a catheter 17 as an example of an invasive device whereto the invention relates and which can be slid into the patient 7, and also a catheter control unit 16. The catheter is shown in greater detail in FIG. 2.

Figure 2:
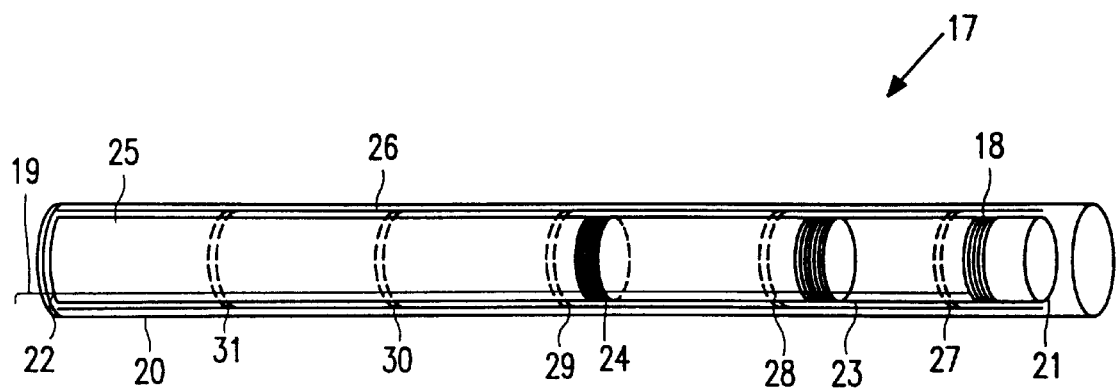
FIG. 2 shows an embodiment of an invasive device with an RF coil and shield.

FIG. 2 shows the catheter 17 which is provided with an RF coil 18 which is connected, via an electric connection 19, to the control unit 16, and an envelope 20 having a distal end and a proximal end. The RF coil 18 is arranged, for example near the distal end. If necessary, some other RF coils 23, 24 can also be arranged in the catheter 17. For the remainder the catheter 17 has a conventional shape and construction. The catheter can be introduced, by way of the distal end, for example, into a blood vessel of the patient and, for example, instruments can be introduced into the patient via the proximal end. The catheter 17 according to the invention also includes a carrier 25. The carrier 25 contains a flexible material, for example a synthetic material, and is constructed as a hollow tube. The diameter of the carrier 25 is between, for example 0.3 mm and 3 mm and its length amounts to, for example from 110 cm to 150 cm.

Using suitably chosen RF pulses and magnetic gradient fields, the magnetic resonance imaging apparatus generates a magnetic resonance signal, in a part of the body in which the catheter is situated. Via the RF coil 18 and a sensitive RF receiver in the catheter control unit 16, the magnetic resonance signal is received from spins within a small volume near the RF coil 18. The magnetic resonance signal received is further processed in the processing unit 14 in which a position of the RF coil 18 is derived from the magnetic resonance signal received. The frequency of the magnetic resonance signal received is the Larmor frequency $L_f$ of the spins in a volume near the RF coil and is given by $2\pi f_L = \gamma B$, in which $\gamma$ is the gyromagnetic constant. The magnetic field B is the sum of the static magnetic field $B_0$ and an applied gradient field G, because the applied gradient field G is linearly dependent on the location and the Larmor frequency is a linear function of the position of the desired volume of the spins of the measured MR signal. The position of the RF coil, and hence of the distal end of the catheter, can be determined in the three coordinate directions by successively generating MR signals with gradient fields $G_x$, $G_y$, $G_z$ in the X, the Y and the Z direction, respectively. Such a method is known from the cited U.S. Pat. No. 5,318,025. An RF field is generated during the generating of magnetic resonance signals by the RF coil. This RF field induces a current in the electric connection 19 of the catheter 17 and the patient 7. Thus, heat is developed which could be annoying to the patient. In order to counteract the development of heat in the catheter 17 and the patient 7, the carrier 25 is provided with an electric shield 26 which, according to the invention, has a resistance which is substantially higher than the resistance of the electric connection 19 over a distance from the distal end 21 to the proximal end 22. Because of the additional resistance in the electric shield, a current induced by the RF field is reduced, so that less heat is developed. A suitable value for the total electric resistance of the electric shield 26 between the proximal end 22 and the distal end 21 is between, for example 500 and 5000 Ohms.

Another possibility consists in providing the electric shield 26 alternately with electrically suitably conductive and electrically less conductive portions, viewed in the longitudinal direction. Such electrically less conductive portions can be implemented, for example as interruptions. FIG. 2 shows such interruptions 27, 28, 29, 30, 31 formed in the electric shield 26 along the carrier 25. The width of the interruptions 27, 28, 29, 30, 31 amounts to, for example 0.5 mm or 1 mm. The use of various interruptions, arranged at regular intervals along the carrier, further reduces the development of heat. The amplitude of standing electromagnetic waves can be reduced by choosing the spacing of two neighboring interruptions to be equal to, for example ⅛ or 1/16 wavelength of the applied RF field in the patient 7. In a magnetic resonance imaging apparatus in which the field strength of the static magnetic field amounts to 1.5 T, the frequency of the applied RF field is approximately 64 MHz and the wavelength in air amounts to approximately 4.6 m.

Figure 3:
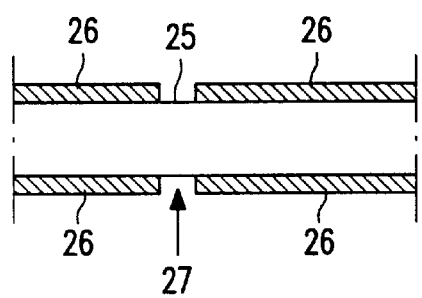
FIG. 3 shows an example of an interruption in the shield.
Figure 4:
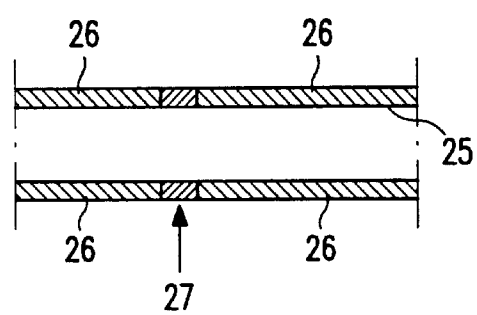
FIG. 4 shows an example of an interruption with resistive material in the shield.

Another possibility of providing the electric shield with a resistance which is higher than the electric resistance of the electric connection extending from the distal end to the proximal end consists in depositing a resistance material on the entire outer circumference of the carrier. FIG. 3 is a cross-sectional view of the catheter 17 with a carrier 25 whose outer surface has been provided with the electric shield 26 containing a resistance material. In order to implement the shielding, the resistance material is uniformly distributed along the carrier 25 in a layer whose thickness suffices to reduce the RF field within the carrier 25. This thickness $\delta$ can be determined from the formula, $$\delta = \sqrt{\left(\frac{2\rho}{\mu_0 \mu_r \omega}\right)},$$

in which $\rho$ is the specific resistance in $\Omega m$, $\mu_0$ is the magnetic permeability in vacuum, and $\mu_r$ is the magnetic permeability of the conductor. The electric shield 26 may be made of a flexible material, so that the catheter 17 can be simply introduced into the body. FIG. 3 also shows in detail a single interruption 27 in the electric shield 26. The interruption in the shield can also contain a resistance material which is provided uniformly along the outer circumference of the interruption. FIG. 4 is a detailed view of such an interruption 27 filled with resistance material.

Another possibility consists in using conductive polymers for the shielding material, for example conductive polyaniline, conductive polythiophene or conductive polypyrrole. The advantage thereof resides in the fact that the electric shield 26 can then be simply provided on the catheter 17. Another possibility yet is the use of a synthetic material for the carrier 25, which is not conductive per se but contains distributed conductive particles which preferably do not contain a paramagnetic material, for example carbon particles.

Figure 5:
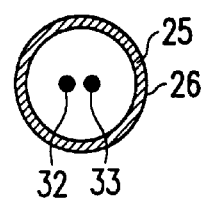
FIG. 5 is a cross-sectional view of the invasive device with the electric connection comprising a two-wire conductor.
Figure 6:
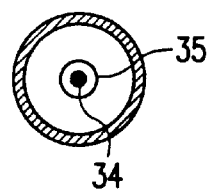
FIG. 6 is a cross-sectional view of the invasive device in which the electric connection comprises two coaxial conductors.

FIG. 5 shows two conductors 32, 33 which constitute the electric connection 19 to the RF coil 18. The diameter of the conductors 32, 33 is, for example 0.1 mm. The electric connection 19 may also be constructed as two coaxial conductors. FIG. 6 shows the coaxial conductors 34, 35. Furthermore, the interior of the carrier 25 is hollow or accommodates parts of further instruments possibly required for the execution of an interventional procedure.

Instead of the catheter, another invasive device can also be used in this embodiment, for example a guide wire, a laparoscope or a biopsy needle.

We claim:

1. An invasive device to be introduced into an object being imaged with a magnetic resonance imaging apparatus comprising:

an elongate envelope which has a distal end and a proximal end, one or more RF coils which are arranged in the envelope, an electric connection for coupling the one or more RF coils to a control unit, and a hollow carrier which is in the envelope and which has a distal end and a proximal end, the electric connection extending through said hollow carrier, said hollow carrier comprising an electrically conductive shield which extends over a distance from the distal end to the proximal end of the hollow carrier, and which has an electric resistance over said distance which is substantially higher than the electric resistance of the electric connection over the same distance.

2. An invasive device as claimed in claim 1, wherein the electric shield comprises alternately, from the distal end to the proximal end, electrically highly conductive portions and electrically less conductive portions.

3. An invasive device as claimed in claim 2, wherein electrically less conductive portions are formed as interruptions in the shield.

4. An invasive device as claimed in claim 2, wherein the electrically conductive shield comprises a flexible material.

5. An invasive device as claimed in claim 2, wherein the electrically conductive shield comprises a conductive synthetic material.

6. An invasive device as claimed in claim 1, wherein the shield comprises a material which is uniformly distributed across the length of the shield and has a specific resistance which is substantially higher than a specific resistance of a material constituting the electric connection.

7. An invasive device as claimed in claim 6, wherein the electrically conductive shield comprises a flexible material.

8. An invasive device as claimed in claim 1, wherein the electrically conductive shield comprises a flexible material.

9. An invasive device as claimed in claim 8, wherein the electrically conductive shield comprises a conductive synthetic material.

10. An invasive device as claimed in claim 1, wherein the electrically conductive shield comprises a conductive synthetic material.

11. An invasive device as claimed in claim 1 wherein the electric connection comprises coaxial conductors.

12. An invasive device as claimed in claim 1, wherein at least one of the one or more RF coils is arranged near the distal end of the envelope.

13. An invasive device as claimed in claim 1, wherein the hollow carrier encloses the one or more RF coils and the electrical connection.

14. A magnetic resonance apparatus for imaging an object with an introduced invasive device comprising:

a first magnet system for generating a static magnetic field in the object, a plurality of gradient coils for generating gradient magnetic fields in the object, one of more RF coils for transmitting RF pulses to the object and for receiving RF signals from the object, and a control unit for controlling the gradient magnetic fields and the RF pulses in order to generate magnetic resonance imaging signals, and an invasive device comprising an elongate envelope which is adapted to be introduced into the object, one or more receiving coils which are arranged in the envelope and which are for receiving the RF pulses, an electric connection for coupling the one or more receiving coils to an invasive-device control unit, and a hollow carrier which is in the envelope and which has a distal end and a proximal end, the electric connection extending through said hollow carrier, said hollow carrier comprising an electrically conductive shield which extends over a distance from the distal end to the proximal end of the hollow carrier, and which has an electric resistance over said distance which is substantially higher than the electric resistance of the electric connection over the same distance.

15. The magnetic resonance imaging apparatus of claim 14 wherein the electrically conductive shield of the invasive device further comprises alternately, from the distal end to the proximal end of the hollow carrier, electrically highly conductive portions and electrically less conductive portions, and wherein the distance between the successive electrically less conductive portions is smaller than or equal to ¼ wavelength of the RF pulses transmitted to the object.

16. An invasive device as claimed in claim 15, wherein the electrically less conductive portions are formed as interruptions in the shield.

17. An invasive device as claimed in claim 16, wherein the electrically conductive shield comprises a flexible material.

18. An invasive device as claimed in claim 16, wherein the electrically conductive shield comprises a conductive synthetic material.

19. An invasive device as claimed in claim 14, wherein the electrically conductive shield comprises a flexible material.

20. An invasive device as claimed in claim 14, wherein the electrically conductive shield comprises a conductive synthetic material.

* * * * *